(12) United States Patent
Ferstl et al.

(10) Patent No.: US 7,564,080 B2
(45) Date of Patent: Jul. 21, 2009

(54) METHOD FOR PRODUCING A LASER DIODE COMPONENT, HOUSING FOR A LASER DIODE COMPONENT, AND LASER DIODE COMPONENT ITSELF

(75) Inventors: Christian Ferstl, Neutraubling (DE); Stefan Grötsch, Lengfeld/Bad Abbach (DE); Markus Zeiler, Nittendorf (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 29 days.

(21) Appl. No.: 10/558,660

(22) PCT Filed: May 26, 2004
(Under 37 CFR 1.47)

(86) PCT No.: PCT/DE2004/001086

§ 371 (c)(1),
(2), (4) Date: Feb. 27, 2007

(87) PCT Pub. No.: WO2004/107511

PCT Pub. Date: Dec. 9, 2004

(65) Prior Publication Data
US 2008/0116551 A1 May 22, 2008

(30) Foreign Application Priority Data
May 26, 2003 (DE) ................. 103 23 857

(51) Int. Cl.
*H01L 29/78* (2006.01)
*H01L 29/94* (2006.01)
*H01L 31/062* (2006.01)
*H01L 31/113* (2006.01)
*H01L 31/119* (2006.01)

(52) U.S. Cl. ............ 257/288; 257/678; 257/787; 257/E21.352; 257/E31.105; 257/E29.327

(58) Field of Classification Search ............ 257/288, 257/428, 678, 787, 910
See application file for complete search history.

(56) References Cited

U.S. PATENT DOCUMENTS 5,035,483 A    7/1991   Waitl et al.

(Continued)

FOREIGN PATENT DOCUMENTS

DE    694 21 434 T2    10/1994

(Continued)

OTHER PUBLICATIONS

European Examination Report issued in the corresponding foreign application No. EP 04 738 555.4.

(Continued)

*Primary Examiner*—David Nhu
(74) *Attorney, Agent, or Firm*—Cohen Pontani Lieberman & Pavane LLP

(57) ABSTRACT

A method for producing a laser diode component having an electrically insulating housing basic body and electrical connecting conductors, which are led out from the housing basic body and are accessible from outside the housing basic body. The housing basic body is produced from a material which is transmissive to a laser radiation emitted by the laser diode component. The housing basic body includes a chip mounting region. A beam axis of the laser diode component runs through the housing basic body. A housing that can be produced in this way and laser diode component having a housing of this type are also disclosed.

25 Claims, 4 Drawing Sheets

U.S. PATENT DOCUMENTS

| | | | |
|---|---|---|---|
| 5,226,052 A | 7/1993 | Tanaka et al. | |
| 5,907,151 A * | 5/1999 | Gramann et al. | 250/214.1 |
| 5,999,552 A | 12/1999 | Bogner et al. | |
| 6,066,861 A | 5/2000 | Höhn et al. | |
| 6,376,902 B1 | 4/2002 | Arndt | |
| 6,396,082 B1 | 5/2002 | Fukasawa et al. | |
| 6,449,296 B1 | 9/2002 | Hamasaki et al. | |
| 6,483,196 B1 | 11/2002 | Wojnarowski et al. | |
| 6,487,224 B1 * | 11/2002 | Ohashi et al. | 372/43.01 |
| 2002/0057567 A1 | 5/2002 | Chen | |
| 2002/0113246 A1 | 8/2002 | Nagai et al. | |
| 2004/0075100 A1 | 4/2004 | Bogner et al. | |

FOREIGN PATENT DOCUMENTS

| | | |
|---|---|---|
| DE | 196 38 667 C2 | 5/2001 |
| DE | 101 17 880 A1 | 10/2002 |
| DE | 101 17 890 A | 10/2002 |
| EP | 0 400 175 A1 | 5/1989 |
| EP | 0 619 608 B1 | 4/1994 |
| EP | 0 809 304 A2 | 5/1997 |
| JP | 10 022576 A | 4/1998 |
| JP | 2001-057444 A | 2/2001 |
| JP | 2002-111066 | 4/2002 |
| WO | WO 00/57522 A | 9/2000 |
| WO | WO 02/084749 A2 | 10/2002 |

OTHER PUBLICATIONS

Examination Report (with English translation) dated Apr. 4, 2008 issued for the counterpart Chinese Patent Application No. 200480014464.12.

Möllmer et al., "Siemens SMT-TOPLED LED's for Surface Mounting", Siemens Components 29, vol. 4, pp. 147-149, 1991.

* cited by examiner

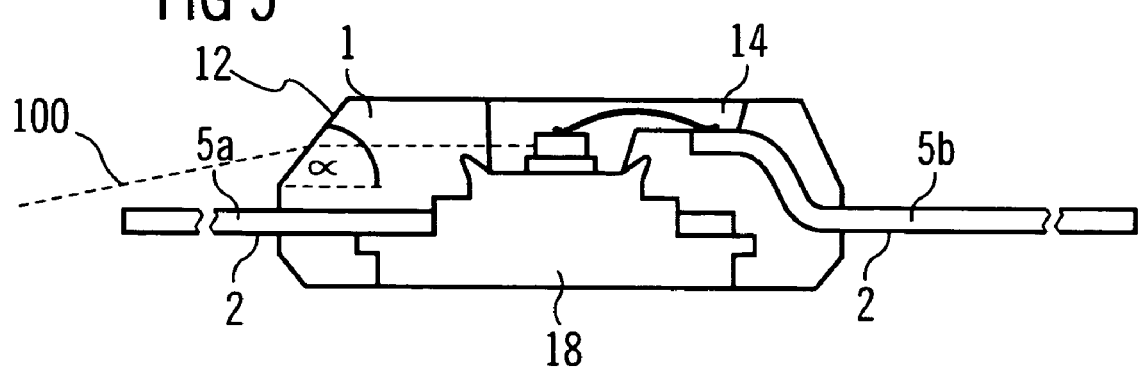

METHOD FOR PRODUCING A LASER DIODE COMPONENT, HOUSING FOR A LASER DIODE COMPONENT, AND LASER DIODE COMPONENT ITSELF

RELATED APPLICATIONS

This is a U.S. national stage of application No. PCT/DE2004/001086, filed 26 May 2004.

This patent application claims the priority of German patent application no. 103 23 857.3, filed 26 May 2003, the disclosure content of which is hereby incorporated by reference.

FIELD OF THE INVENTION

The invention relates to a method for producing a laser diode component, in particular a surface-mountable laser diode component having a plastic housing.

It furthermore relates to a housing for a laser diode component having an electrically insulating housing basic body and electrical connecting conductors, which are led out from the housing basic body and are accessible from outside the housing basic body, and to a laser diode component having such a housing.

BACKGROUND OF THE INVENTION

Laser diode components are conventionally generally produced with technically complicated metal housings or encapsulated otherwise in a technically complicated manner as is described for example in U.S. Pat. No. 5,226,052.

SUMMARY OF THE INVENTION

It is one object of the present invention to provide a simplified method for producing a surface-mountable laser diode component which makes it possible to employ conventional, technically comparatively simple and, thus, cost-effective processes from semiconductor optoelectronics.

This and other objects are attained in accordance with one aspect of the present invention directed to a method for producing a laser diode component having an electrically insulating housing basic body, a laser diode chip, a chip mounting region in the housing basic body, in which the laser diode chip is arranged, and having electrical connecting conductors. The electrical conductors are electrically connected to electrical contacts of the laser diode chip, are led out from the housing basic body and are accessible from outside the housing basic body. The method comprises the steps of providing a leadframe having the electrical connecting conductors, forming the housing basic body with the chip mounting region at the leadframe in such a way that the electrical connecting conductors project from the latter, mounting the laser diode chip into the chip mounting region of the housing basic body, electrically connecting the electrical contacts of the laser diode chip to the electrical connecting conductors, and encapsulating the laser diode chip with an encapsulation composition, which is transmissive to a laser radiation emitted by the laser diode chip during operation.

Another aspect of the present invention is directed to a housing for a laser diode component having an electrically insulating basic body and electrical connecting conductors which are led out from the housing basic body and are accessible from outside the housing basic body. The housing basic body is made from a material which is transmissive to a laser radiation to be emitted by the laser diode component. A chip mounting region is provided in the housing basic body. A beam axis of the laser diode component proceeding from the laser diode chip runs obliquely along or essentially parallel along with respect to the area formed by the chip mounting region and through the housing basic body.

In the case of a surface-mountable housing according to an embodiment of the invention, the housing basic body is produced from a material which is transmissive to a laser radiation to be emitted by the laser diode component, and comprises a chip mounting region, and a beam axis of the laser diode component runs through the housing basic body. The material of the housing basic body that is transmissive to the laser radiation makes it possible to dispense with deflecting the laser beam emitted by the laser chip. The emitted laser beam is transmitted directly through a housing wall of the housing basic body.

It is furthermore preferred for a beam axis of the laser diode chip to run obliquely along or essentially parallel along with respect to a plane defined by the chip mounting region. The laser diode chip is preferably an edge emitting laser diode chip.

The production of the housing basic body, which takes place for example by surrounding a metallic leadframe with a molding composition by injection molding, involves the use of a radiation-transmissive molding composition. Whereas it is necessary to implement measures for deflecting the emitted light beam in the case of conventional housings, this is essentially completely obviated in the case of this housing according to the invention. Subsequently, the laser diode chip is mounted into the chip mounting region of the housing basic body, electrical contacts of the laser diode chip are connected to the electrical connecting conductors and the laser diode chips are encapsulated with an encapsulation composition.

In the case of the housing, the recess primarily serves for receiving the laser diode chip and for the electrical connection thereof. The recess does not have to fulfill a more extensive optical function in the present case. However, the side walls that delimit the recess may have absorbing, reflective or scattering properties in partial regions through which no laser radiation is to emerge.

In the case of the housing described above, the beam axis preferably runs essentially parallel to a chip mounting area in the chip mounting region. The consequence of this is that for example in the case of a housing basic body in which one of the side areas serves as a mounting area (that is to say as a bearing area for example on a printed circuit board), it is possible to obtain a beam axis perpendicular to the mounting plane, for example of a printed circuit board.

Preferably, the housing basic body is formed from a transparent molding composition, in particular from a transparent plastic. It is particularly preferred for the molding composition to be at least briefly thermostable up to approximately 260° C. This ensures that the thermal loads that occur momentarily in a soldering process (temperatures of up to 260° C. usually arise in this case) leave the housing undamaged to the greatest possible extent.

In one preferred refinement, the plastic contains polyethersulfone (PES). This material is also known by the name Ultrason.

In accordance with a further preferred refinement of the housing, at least one outer side area of the housing basic body is provided with an optical device. This affords the possibility of deflecting the laser beam emitted by the laser diode chip in a desired direction. Instead of providing the optical device at an outer wall of the housing basic body, said optical device could equally be provided in a mounting housing into which the housing itself is introduced for mounting.

The optical device might be for example a partial region of the side area of the housing basic body which is situated obliquely with respect to the beam axis of the laser beam, said side area being obtained for example solely by means of a mold release bevel and serving for deflecting the laser beam. The use of a lens for obtaining an additional collimation is alternatively conceivable.

In order advantageously to be able to have recourse to conventional production processes from light emitting diode technology, in the case of the housing according to the invention, one preferred refinement provides for the chip mounting region and the electrical connection conductors to be constituent parts of a metallic leadframe. Such production processes are found for example in U.S. Pat. No. 5,035,483 or U.S. Pat. No. 6,376,902 the disclosure contents of which are hereby incorporated by reference.

In one advantageous refinement, the chip in the chip receptacle region is at least partly encapsulated with a radiation-transmissive potting composition, in particular a plastic composition, such as a casting resin, or a molding composition. The plastic composition preferably contains an epoxy resin, an acrylic resin, a silicone resin or a mixture of these resins.

It is furthermore advantageous if the materials of the potting composition and of the housing basic body are adapted to one another with regard to their refractive indices. This also holds true when the optical device is not provided in an outer wall of the housing basic body, but rather in a mounting housing into which the housing and thus the housing basic body are inserted. The refractive indices of the housing basic body and the mounting housing have to be adapted to one another in this case. It goes without saying that the mounting housing containing an optical device is transparent in this region.

In the case of another preferred housing according to the invention, there is arranged at the housing basic body, preferably in a recess of the housing basic body in which the chip mounting region is situated, in contrast to the previously described preferred surface-mountable housing and the advantageous embodiments and developments thereof, a beam deflecting element, for example a mirror element, which deflects the laser beam of the laser diode chip in such a way that it does not radiate through the housing basic body. The housing basic body can then preferably be produced from a material that is largely radiation-opaque or not readily transmissive to radiation, and be optimized with regard to parameters other than radiation transmissivity, such as thermal stability for example. A chip mounting base exhibiting good thermal conduction is preferably situated in the housing basic body, which chip mounting base can preferably be thermally connected from outside the housing basic body, preferably from a rear side or alternatively from a side area of the housing basic body.

One method for producing a laser diode component according to an embodiment of the invention comprises the following method steps of: providing a metallic leadframe having the electrical connecting conductors, surrounding a partial region of the leadframe including partial regions of the electrical connecting conductors with the housing basic body by molding, mounting the laser diode chip into the chip mounting region of the housing basic body, electrically connecting the electrical contacts of the laser diode chip to the electrical connecting conductors, and encapsulating the laser diode chip with the encapsulation composition.

In one advantageous embodiment of the method, before the leadframe is surrounded with the housing basic body by molding, the leadframe is assigned a chip mounting base which exhibits good thermal conduction and on which the laser diode chip is subsequently fixed and which can be thermally connected from outside the housing basic body. Housing designs of this type are described in principle for example in published US application no. 2004/0075100 and in DE 101 17 890, the disclosure content of which is in this respect hereby incorporated by reference.

In the production of laser diode components, a housing according to the invention advantageously makes it possible to employ methods which are known from and used in light emitting diode technology. In this case, a prehoused device is produced by surrounding a prefabricated metallic leadframe with a suitable diffusely reflective plastic material by injection molding. The plastic molding produced in this case has a recess toward the leadframe. In this recess, a light emitting diode chip is mounted onto the leadframe and electrically connected to electrical connecting conductors leading toward the outside. The light emitting diode chip is subsequently potted with a transparent potting composition. Housing designs of this type are disclosed for example in F. Möllmer and G. Waitl, SIEMENS SMT-TOPLED für die Oberflächenmontage [SIEMENS SMT-TOP LED for surface mounting], Siemens Components 29 (1991), issue 4, pages 147-149. Similar housings for light emitting diode components are furthermore disclosed in WO 02/084749 A2, the disclosure content of which is in this respect hereby incorporated by reference.

A housing according to the invention with a radiation-transmissive housing basic body and without a beam deflecting element can advantageously be used not just for edge emitting laser diode chips, but is also suitable for other in particular edge emitting radiation-emitting semiconductor chips, such as light emitting diode chips for example.

In the case of this method, the laser diode chip is consequently mounted onto a so-called prehoused (premolded) metallic leadframe. For example by means of soldering.

Preferably, a chip mounting base exhibiting good thermal conduction and acting as a heat sink during operation of the laser diode component is arranged in the housing basic body. The laser diode chip is preferably mounted onto this chip mounting base.

Particularly preferably, for this purpose, before the leadframe is surrounded with the housing basic body by molding, the leadframe is provided with a chip mounting base which exhibits good thermal conduction and acts as a heat sink during operation of the laser diode component and on which the laser diode chip is subsequently thermally conductively fixed and which can be thermally connected from the rear side of the laser diode component.

Preferably, for this purpose, before the leadframe is surrounded with the housing basic body by molding, the leadframe is provided with a chip mounting base which exhibits good thermal conduction and acts as a heat sink during operation of the laser diode component and on which the laser diode chip is subsequently thermally conductively fixed and which is surrounded with the housing basic body by molding in such a way that it is at least partly uncovered at the rear side thereof and can be thermally connected there.

The housing basic body is advantageously produced from a plastic material. A plastic material based on epoxy resin or acrylic resin is preferably used for this purpose.

A silicone-based plastic material is preferably used as the encapsulation composition of the laser diode chip.

In a particularly preferred refinement of the method, a recess is formed in the housing basic body, at which or in which recess the chip mounting region and connecting regions of the electrical connecting conductors are situated and in which recess the light emitting diode chip is arranged.

In a furthermore advantageous embodiment of the method configuration, a laser diode chip whose beam axis runs obliquely along or essentially parallel along with respect to a plane defined chip mounting area of the chip mounting base is arranged in the recess, and a beam deflecting element, for example a mirror element, is arranged in the recess in the beam axis of the laser diode chip, which mirror element is suitable for deflecting a laser radiation of the laser diode chip toward an intended beam axis of the laser diode component.

The beam deflecting element is preferably arranged obliquely with respect to the beam axis of the laser diode chip in such a way that the beam axis of the laser diode component runs essentially perpendicular to the plane defined by the chip mounting area.

For simpler positioning and fixing of the mirror element, a planar area situated obliquely with respect to the beam axis of the laser diode chip is formed at a side wall of the recess, the mirror element subsequently being fixed at said area.

The connecting conductors may be easily shaped in such a way that the laser diode component is surface-mountable.

BRIEF DESCRIPTION OF THE DRAWINGS

FIG. 5 shows a variation of the laser diode component depicted in FIG. 4d.

DETAILED DESCRIPTION OF THE DRAWINGS

In the exemplary embodiments and the associated figures, identical or identically acting constituent parts are in each case provided with the same reference symbols. The drawings of the figures are not to be regarded as true to scale.

Figure 1:
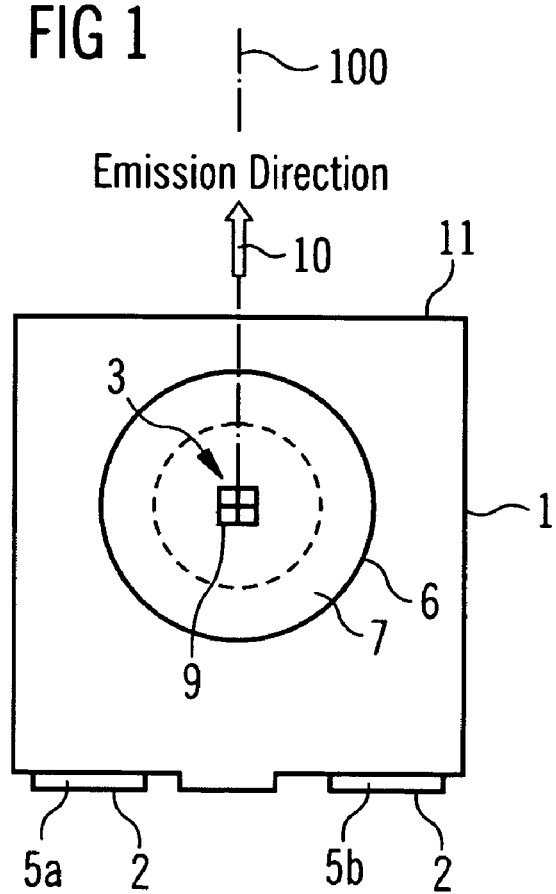
FIG. 1 shows a schematic illustration of a first exemplary embodiment of a laser diode component in a side view.
Figure 2:
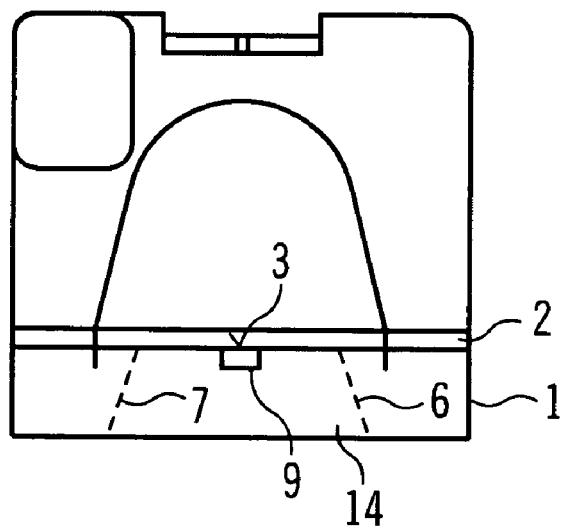
FIG. 2 shows a schematic illustration of the exemplary embodiment of FIG. 1 in a plan view.

The housing of the exemplary embodiment of a laser diode component as illustrated in FIGS. 1 and 2 has a housing basic body 1, from which electrical connecting conductors 5a, 5b in the form of connecting strips are led out at one side, here the mounting side of the component. The connecting conductors 5a, 5b are part of a metallic leadframe 2, onto which the housing basic body 1 is integrally formed and which is led into the interior of the housing basic body. In order to produce the housing basic body 1, by way of example, as already described further above, an injection or compression mold with a cavity for the housing basic body 1 is placed onto the leadframe 2 and a molding composition is injected into the cavity, thus giving rise to the desired form of the housing basic body. Such housing designs in which the housing basic body is injection-molded or compression-molded onto the leadframe before the mounting of the chip are referred to for example as premolded housings.

The housing basic body 1 comprises for example a transparent material, in particular a transparent plastic preferably comprising polyethersulfone PES. This means nothing more than that the entire housing basic body 1 is transmissive to the laser radiation emitted by a laser diode chip 9 provided for mounting in the housing basic body 1. For an infrared laser diode component, the plastic of the housing basic body 1 need not necessarily be transparent. It merely has to transmit the infrared laser radiation emitted.

The housing basic body 1 has, from a side area toward the leadframe 2, a recess or cavity 6, which is embodied with a round cross section by way of example as seen from outside. The cross section may in principle also have any other form desired.

The recess 6 of the housing basic body 1 is adjoined by a chip mounting region 3 and electrical connecting regions of the leadframe 2, so that this is accessible, after the leadframe 2 has been surrounded with the housing basic body 1 by molding, from outside for mounting and for electrically connecting the laser diode chip 9 through the recess 6.

In the case of a finished laser diode component, a laser diode chip 9 is mechanically fixed on the chip mounting region 3 by means of an electrically conductive connection material. The connection material produces an electrically conductive connection between an underside electrical contact of the laser diode chip 9 and the chip mounting region 3, which is electrically conductively connected to the first of the two electrical connecting conductors 5a, 5b. A top-side electrical contact of the laser diode chip 9 is electrically connected to the second of the two connecting strips 5a, 5b for example via a wire connection (not shown).

The bottom of the recess may have for example an area which is smaller compared with the opening at the main area of the housing basic body, with the result that a side wall 7 inclined relative to the bottom of the housing is formed. In the region of the side wall 7 which is provided for coupling the laser beam of a laser diode chip 9 into the housing basic body 1, the side wall may be perpendicular to the beam axis 100 of the laser beam.

The beam axis of the laser diode component is illustrated by the arrow 10 in FIG. 1. The beam axis 10 thus lies in the plane of the page. This results from the fact that the radiation emitted by the chip 9 is not deflected after impinging on the side wall 7, but rather passes through the latter.

The laser diode chip 9 arranged in the recess 6 is encapsulated with a radiation-transmissive potting composition, in particular a plastic composition, such as, for example, a casting resin, or a compression molding composition. The plastic composition may contain epoxy resin, silicone or PMMA, for example.

The refractive indices of the radiation-transmissive potting composition and of the transparent housing basic body are preferably adapted to one another, that is to say identical or at least very similar to one another. It is thereby possible to reduce reflections in the housing.

The housing basic body 1 is usually mounted onto a printed circuit board by its connecting strips 5a, 5b. The connecting strips 5a, 5b lie at a side area of the housing basic body 1 in the case of the component in accordance with FIG. 1. The beam axis 10 of this component runs perpendicular to the plane of the printed circuit board or some other component carrier.

The concept on which the invention is based consists in the fact that the housing walls of the housing basic body 1 do not diffusely scatter or reflect the laser beam emitted by the laser diode chip, rather that said housing walls are radiation-transmissive. The beam can thus leave the housing without deflection.

In order to reduce a possible undesirable emission through side areas of the housing basic body, the side walls of the housing basic body may be provided with a radiation-absorbing layer or a mounting housing surrounding said side walls.

In the region from which the laser beam couples out from the housing basic body 1, the outer wall 11 may be provided with an optical device, e.g. an obliquely situated area for deflecting the laser beam or a lens for collimation of the laser beam. The obliquely situated area may be formed for example by a mold release bevel. Since a corresponding arrangement and configuration are straightforwardly familiar to a person skilled in the art, a detailed illustration is dispensed with at this point.

Figure 3:
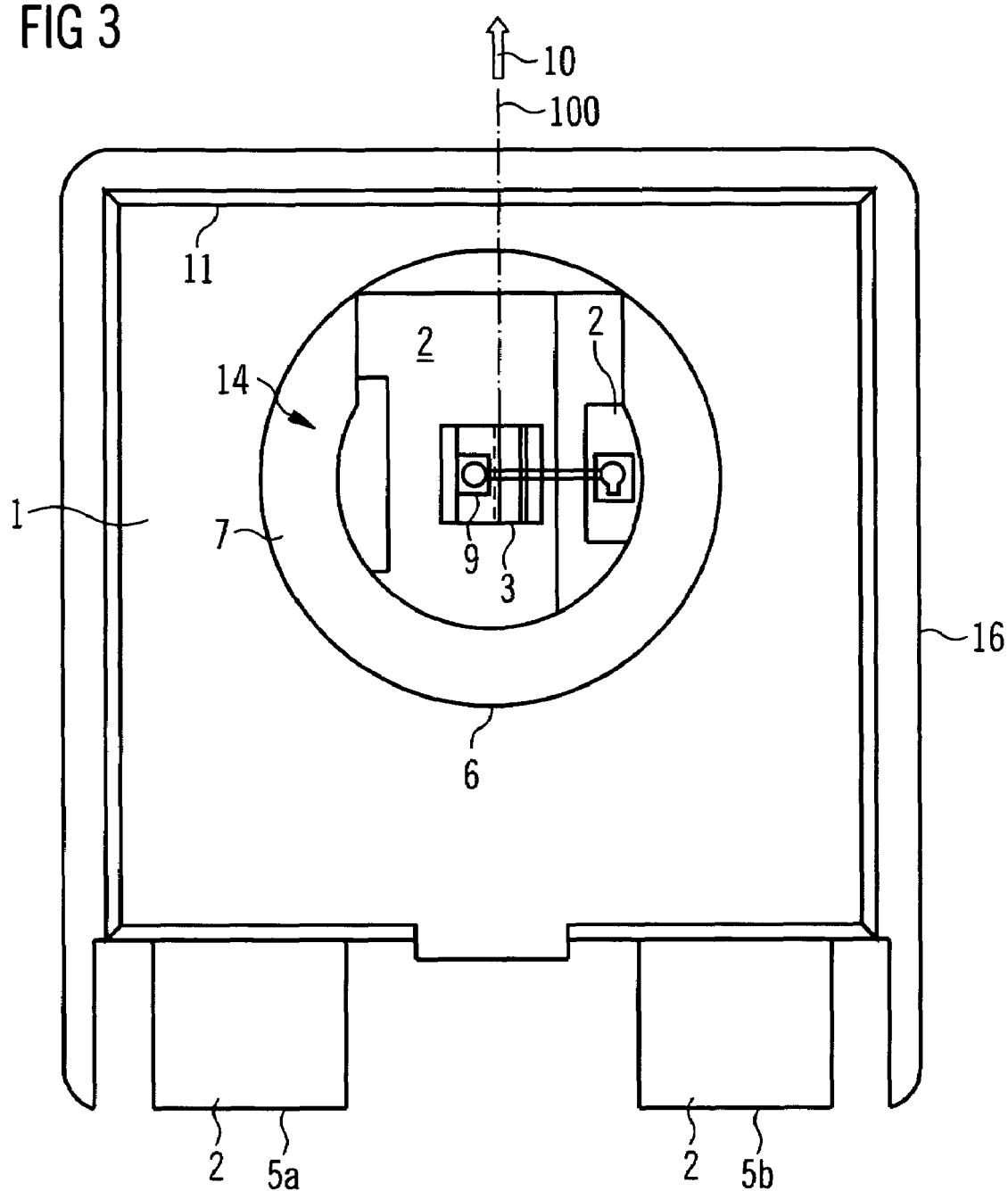
FIG. 3 shows a schematic illustration of a further exemplary embodiment of a laser diode component with a mounting housing in a side view.

The radiation-emitting laser diode component in accordance with FIG. 3 is formed in a similar manner to that of FIGS. 1 and 2. One difference consists, in particular, in the fact that a part of the connecting strips 5a, 5b is spaced from the housing surface, for surface mounting such that the beam axis 10 runs parallel to the printed circuit board or some other component carrier.

The recess 6 again has a side wall arranged inclined relative to the bottom of the recess. Relative to the emitting side area of the laser diode chip 9, however, the side wall of the recess 6 lies parallel to said side area of the laser diode chip 9. This makes it possible to obtain a particularly good transition in the boundary region between the transparent potting composition 14, which is likewise arranged in the recess 6 and surrounds the laser diode chip 9, and the transparent housing basic body 1.

In contrast to the previous exemplary embodiment, the housing basic body 1 is situated in a plastic mounting housing 16 which enables a simple plug-in and soldering mounting of the radiation-emitting component on a printed circuit board.

The optical device, e.g. in the form of a mold release bevel or a lens, can now be arranged in the mounting housing 16, as a result of which the production can be simplified further.

The invention enables radiation-emitting components in which it is possible to achieve a radiation in a perpendicular direction with respect to a printed circuit board without deflection, even if a side looker is used. In this case, it is possible to have recourse to known SMT (Surface Mount Technology) housings which are optimized with regard to heat dissipation, for example, which makes them ideal for an application with a diode laser. The use of production tools of an SMT housing for powerful pulsed lasers is thus possible. If a defined deflection of the beam is required, such as in the case of an infrared floodlight for example, then it would be possible to use an array comprising a plurality of laser diode components with respectively changed mold release bevels at the outer wall of the housing basic body or of a possible mounting housing.

In the case of a method for producing a laser diode component in accordance with the exemplary embodiment, firstly provision is made of a metallic leadframe having a chip connecting region and electrical connecting conductors 5a, 5b. A partial region of the metallic leadframe including partial regions of the electrical connecting conductors 5a, 5b is then surrounded with the housing basic body 1 by molding. After the laser diode chip 9 has been mounted into the chip mounting region of the housing basic body 1, the electrical contacts of the laser diode chip 9 are electrically connected to the electrical connecting conductors 5a, 5b. The laser diode chip 9 is then encapsulated with the potting composition 14.

In one preferred embodiment, before the leadframe is surrounded with the housing basic body 1 by molding, a chip mounting base 18 exhibiting good thermal conduction is mounted into the leadframe, said chip mounting base having a chip mounting area 31 adjoining the chip mounting region 3. The laser diode chip 9 is subsequently fixed on the chip mounting base 18, which can be thermally connected from outside the housing basic body.

Figure 4A:
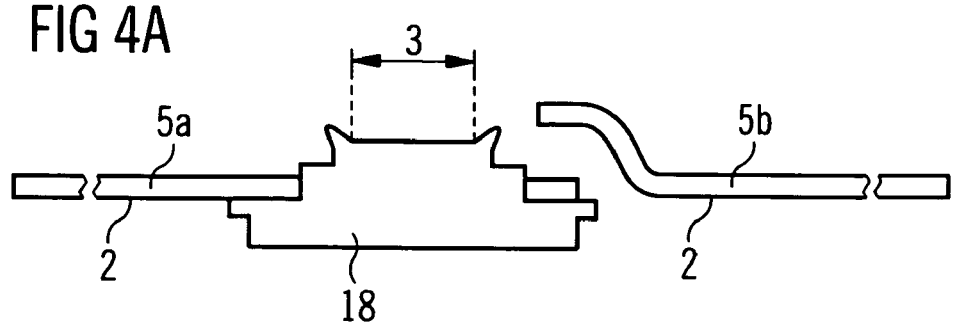
FIGS. 4a to 4d show a schematic illustration of a method sequence according to another embodiment of the invention for producing a surface-mountable laser diode component.
Figure 4B:
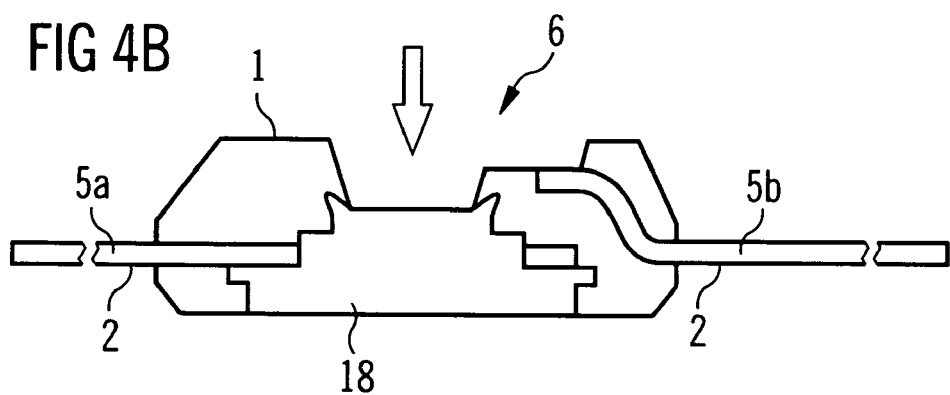

In the case of the method—illustrated schematically in FIGS. 4a to 4b—for producing a laser diode component having an electrically insulating housing basic body 1, which comprises a chip mounting region 3, having electrical connecting conductors 5a, 5b, which are led out from the housing basic body 1 and are accessible from outside the housing basic body 1, for accommodating a laser diode chip 9, which is to be arranged in the chip mounting region 3, and has electrical contacts electrically conductively connected to the electrical connecting conductors 5a, 5b, firstly provision is made of a metallic leadframe 2 having electrical connecting conductors 5a, 5b. A chip mounting base 18, which exhibits good thermal conduction and functions as a heat sink and is made of copper or some other metallic material exhibiting good thermal conductivity, is linked into one of the two electrical connecting conductors 5a (FIG. 4a).

A housing basic body 1 with a recess 6 encompassing a chip mounting region 3 is integrally formed onto the leadframe 2 with the chip mounting base 18 for example by means of an injection-molding or transfer-molding method (FIG. 4b), said housing basic body being composed for example of a plastic material based on epoxy or acrylic resin. The electrical connecting conductors 5a, 5b project from the housing basic body 1 on mutually opposite side areas of said housing basic body. The chip mounting base 18 on the one hand adjoins the recess 6, in order to receive the laser diode chip 9, runs through the housing basic body 1 toward the rear side thereof and, on the other hand, is uncovered there.

After the leadframe 2 is surrounded with the housing basic body 1 by molding, an edge emitting laser diode chip 9 is mounted in the recess 6 onto the chip mounting base 18 in such a way that its beam axis 10 runs essentially parallel along with respect to a plane defined by a chip mounting area 31 of the chip mounting region 3. A thermally conductive carrier lamina 20 made of SiC or AlN or some other suitable thermally conductive material is preferably arranged between the laser diode chip 9 and the chip mounting base 18 (FIG. 4c).

Figure 4C:
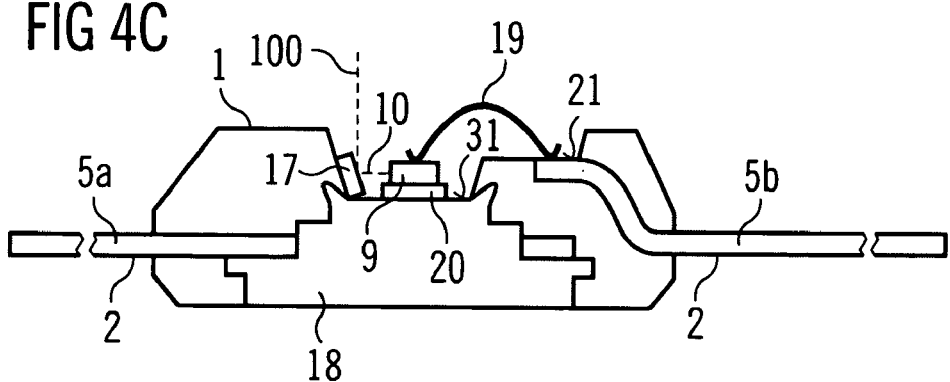

In the beam axis 10 of the laser diode chip 9, before or after the laser diode chip 9 is mounted on the chip mounting base 18, a mirror-coated glass lamina functioning as mirror element 17 for a laser radiation emitted by the laser diode chip 9 is arranged in the beam axis 10 of the laser diode chip 9 and obliquely with respect thereto at the housing basic body 1 in such a way that it deflects the laser radiation from the beam axis 10 of the laser diode component toward the intended beam axis 100 of the laser diode component (FIG. 4c). In the present case, the beam axis 100 of the laser diode component runs essentially perpendicular to the plane defined by a chip mounting area 31 of the chip mounting region 3. The chip mounting area 31 is an area of the chip mounting base 18 which is uncovered in the recess 6.

For technically simpler fixing and positioning of the mirror-coated glass lamina, a planar area situated obliquely with respect to the beam axis 10 of the laser diode chip 9 is formed as early as during the production of the housing basic body 1 per se in the beam axis 10 of the provided laser diode chip 9 at a suitable location at a side wall of the recess 6, the glass lamina subsequently being fixed to said planar area.

Before or after the mounting of the glass lamina, at least one electrical contact of the laser diode chip 9 is connected, by means of at least one bonding wire 19, to a connecting area 21 of the electrical connecting conductor 5b that is uncovered in the recess 6 (FIG. 4c).

Finally, the recess 6 is potted with an encapsulation composition 14, which is transmissive to a laser radiation emitted by the laser diode chip 9 during operation. By way of example, a simple potting of the laser diode chip 9 in the recess 6 may be effected for this purpose. However, the use of an injection-molding or transfer-molding method is likewise also conceivable for this purpose. By way of example, a plastic material based on silicone resin or some other suitable plastic material may be used as the encapsulation composition 14.

Finally or at some other suitable point in time in the method, the partial regions of the connecting conductors 5a, 5b that are situated outside the housing basic body are formed in such a way that the laser diode component is surface-mountable.

Figure 4D:
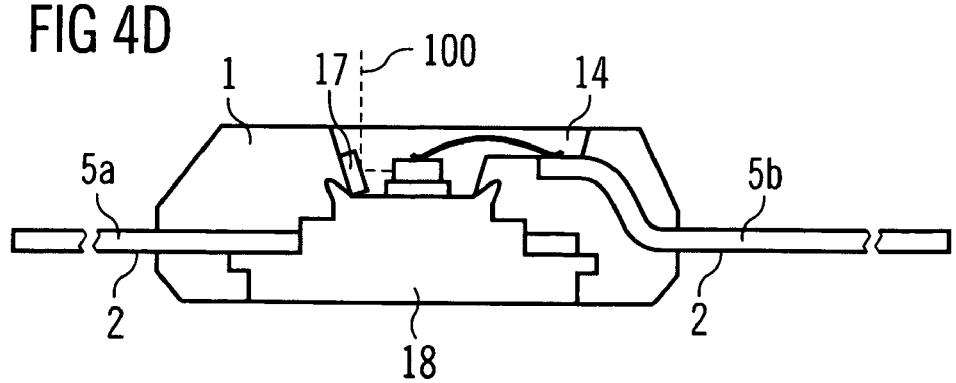

The diode component shown in FIG. 5 is similar to the one shown in FIG. 4D. The difference between the component shown in FIG. 5 and that shown in FIG. 4D is that in FIG. 5 there is no mirror-coated glass laminar 17. Instead, the mold release bevel 12 functions as an optical device that deflects the laser beam 100 at an outer area of the housing 1.

In the laser diode component shown in FIG. 5, two or more laser diode chips 9 can be arranged in the housing basic body 1. In this case it is possible to provide at least one outer area of the housing with two or more beam deflecting bevels which are different from one another. The different beam deflecting bevels particularly have different tilt angles α with respect to a plane that is parallel to a mounting plane of at least one of the diode chips or of the component. For example, a first deflecting bevel comprises a tilt angle α of 60° and a second deflecting bevel comprises a tilled angle α of 75°. Tilt angles might also be greater than 90°.

It is also possible to use a plurality of laser diode components, e.g. in a laser flash light, in which the obliquely situated deflecting areas 12 of at least two housings are different from one another. For example, a first housing comprises a beam deflecting bevel with a tilted angle α of 80° and a second housing comprises a beam deflecting bevel with a tilted angle α of 100°.

It goes without saying that the exemplary description on the basis of the exemplary embodiments does not restrict the invention thereto. Rather, the invention encompasses any new feature and also any combination of features, which in particular comprises any combination of individual features of the various patent claims or of the various exemplary embodiments among one another, even if the relevant feature or the relevant combination is itself not explicitly specified in the patent claims or exemplary embodiments.

The invention claimed is:

1. A housing for a laser diode component, comprising:
an electrically insulating housing basic body of a material which is transmissive to a laser radiation emitted by the laser diode component;
electrical connecting conductors led out of the housing basic body and accessible from outside the housing basic body; and
a chip mounting region provided in the housing basic body, wherein a beam axis of the laser diode component extends obliquely along or essentially parallel to an area formed by the chip mounting region and through the housing basic body; and
wherein the housing basic body has an area which delimits a cavity and through which the laser radiation is coupled into the housing basic body having, to the greatest possible extent, no reflective or scattering properties.

2. The housing for a laser diode component according to claim 1, wherein the chip mounting region is arranged in the cavity of the housing basic body.

3. The housing for a laser diode component according to claim 1, wherein the housing basic body is made from a molding composition.

4. The housing for a laser diode component according to claim 3, wherein the molding composition is at least thermostable up to 260° C.

5. The housing for a laser diode component according to claim 3, wherein the molding composition contains polyethersulfone (PES).

6. The housing for a laser diode component according to claim 1, wherein at least one outer area of the housing basic body is provided with an optical device.

7. The housing for a laser diode component according to claim 6, wherein the optical device is an area situated obliquely with respect to the beam axis between the chip mounting region and the outer area and operable to deflect a laser beam.

8. The housing for a laser diode component according to claim 7, wherein the obliquely situated area is a mold release bevel of the housing basic body.

9. The housing for a laser diode component according to claim 6, wherein the optical device is a lens for obtaining a collimation.

10. The housing for a laser diode component according to in claim 6, wherein the electrical connecting conductors are in the form of a metallic lead frame.

11. The housing for a laser diode component according to claim 10, wherein the leadframe comprises a chip mounting area, on which a laser diode chip can be mounted.

12. The housing for a laser diode component according to claim 1, wherein the housing is surface-mountable.

13. A laser diode component having a housing as claimed in claim 1, and a laser diode chip mounted in the chip mounting region, wherein the laser diode chip comprises electrical contacts electrically conductively connected to the electrical connecting conductors.

14. The laser diode component according to claim 13, wherein the laser diode chip is an edge emitting laser diode chip.

15. The laser diode component according to claim 13, wherein the laser diode chip is at least partly encapsulated with a radiation-transmissive encapsulation composition.

16. The laser diode component according to claim 13, wherein the encapsulation composition contains an epoxy resin, an acrylic resin, a silicone resin or a mixture of these resins.

17. The laser diode component according to claim 15, wherein materials of the encapsulation composition and of the housing basic body are adapted to one another with regard to their refractive indices.

18. The laser diode component according to claim 13, wherein the laser diode component is arranged in a mounting housing and materials of the mounting housing and of the housing basic body are adapted to one another with regard to their refractive indices.

19. The laser diode component according to claim 13, further comprising a plurality of laser diode chips arranged in the housing basic body.

20. The laser diode component according to claim 19, further comprising a beam deflecting bevel assigned to each laser diode chip at an outer area of the housing basic body, wherein at least two of the beam deflecting bevels are different from one another.

21. A laser floodlight having a plurality of laser diode components as claimed in claim 13, wherein at least two housings have obliquely situated areas that are different from one another.

22. The housing for a laser diode component according to claim 1, wherein the housing basic body is made from a plastic material.

23. The laser diode component according to claim 13, wherein the laser diode chip is at least partly encapsulated with a plastic potting composition or a plastic molding composition.

24. A housing for a laser diode component, the housing comprising:
- an electrically insulating housing basic body of a material which is transmissive to a laser radiation to be emitted by the laser diode component;
- electrical connecting conductors led out of the housing basic body and accessible from outside the housing basic body; and
- a chip mounting region provided in the housing basic body,
- wherein a beam axis of the laser diode component extends obliquely along or essentially parallel to an area formed by the chip mounting region and through the housing basic body, and
- wherein the housing basic body is of a molding composition that is at least briefly thermostable up to 260° C.

25. A housing for a laser diode component, the housing comprising:
- an electrically insulating housing basic body of a material which is transmissive to a laser radiation to be emitted by the laser diode component;
- electrical connecting conductors led out of the housing basic body and accessible from outside the housing basic body; and
- a chip mounting region provided in the housing basic body,
- wherein a beam axis of the laser diode component extends obliquely along or essentially parallel to an area formed by the chip mounting region and through the housing basic body, and
- wherein the housing basic body is of a molding composition that contains polyethersulfone (PES).

* * * * *